United States Patent
Tai et al.

(10) Patent No.: US 8,330,108 B2
(45) Date of Patent: Dec. 11, 2012

(54) POWER CONTROL CIRCUIT OF A VARIABLE-FREQUENCY OPTO-INTERRUPTER FOR A PRINTER

(75) Inventors: Feng-Yi Tai, Chung-Ho (TW); Ta-Cheng Hsiung, Hsinchu (TW)

(73) Assignee: Godex International Co., Ltd., Chung-Ho (TW)

( * ) Notice: Subject to any disclaimer, the term of this patent is extended or adjusted under 35 U.S.C. 154(b) by 659 days.

(21) Appl. No.: 12/618,782

(22) Filed: Nov. 16, 2009

(65) Prior Publication Data

US 2011/0114841 A1    May 19, 2011

(51) Int. Cl.
*H01L 31/02* (2006.01)

(52) U.S. Cl. ............. 250/338.1; 250/221; 250/205; 250/216

(58) Field of Classification Search ........... 250/338.1
See application file for complete search history.

(56) References Cited

U.S. PATENT DOCUMENTS

| | | | | |
|---|---|---|---|---|
| 4,808,809 A * | 2/1989 | Hayakawa | ............ | 250/205 |
| 4,937,441 A * | 6/1990 | Ishizawa et al. | ............ | 250/205 |
| 5,214,271 A * | 5/1993 | Rogers et al. | ............ | 250/205 |
| 5,878,288 A * | 3/1999 | Okumura et al. | ............ | 396/83 |
| 5,962,841 A * | 10/1999 | Okumura et al. | ............ | 250/205 |
| 6,041,187 A * | 3/2000 | Okumura et al. | ............ | 396/132 |
| 6,164,844 A * | 12/2000 | Okumura et al. | ............ | 396/447 |
| 6,858,835 B2 * | 2/2005 | Smith | ............ | 250/231.1 |
| 7,374,163 B2 * | 5/2008 | Cook et al. | ............ | 271/145 |
| 7,866,903 B2 * | 1/2011 | Hatada et al. | ............ | 400/76 |
| 2005/0263688 A1 * | 12/2005 | Kauhanen | ............ | 250/231.13 |
| 2009/0050793 A1 * | 2/2009 | Asano et al. | ............ | 250/221 |

* cited by examiner

*Primary Examiner* — David Porta
*Assistant Examiner* — Djura Malevic

(57) ABSTRACT

A power control circuit of a variable-frequency opto-interrupter for a printer has a plurality of impedances electrically connected with a receiving terminal of the opto-interrupter in parallel for multi-stage variable adjustment, an IR photodiode having stronger penetration and adopted to a transmitting terminal, and a variable frequency generator generating variable frequency signal and electrically connected with a negative pole pin of the IR photodiode through a switching transistor. Accordingly, the emitting intensity of the opto-interrupter is significantly enhanced so that various printing media are penetrated through by infrared beams and the emitting intensity is adjusted to adapt to acquire a broader dynamic range of the load of the receiving terminal.

10 Claims, 6 Drawing Sheets

POWER CONTROL CIRCUIT OF A VARIABLE-FREQUENCY OPTO-INTERRUPTER FOR A PRINTER

FIELD OF THE INVENTION

The present invention is related to a power control circuit, and more particularly to a power control circuit of a variable-frequency opto-interrupter for a printer, which employs variable frequency signals to adjust emitting intensity of an IR photodiode so as to penetrate through various printing media and acquire a broader dynamic range.

BACKGROUND OF THE INVENTION

Printers have many types, such as inkjet printers, laser printers, heat transfer printers, sublimation printers and the like. However, regardless of what types of printers, if intending to have a broader application scope and finer printing quality, all printers are additionally equipped with automatic detection functions of ink of printing ribbon and length of printing papers. For example, a circuit of an opto-interrupter mounted to a thermal printer is one of the typical examples. The circuit is adopted to control voltage or vary load impedance to set up the dynamic ranges of a transmitter and a receiver so as to increase circuit recognition in response to different operation requirements.

Whereas, the transmitter of the conventional structural design normally employs regular light-emitting diode (LED), and the load impedance adopted by both of the transmitter and the receiver is usually fixed. Accordingly, the adopted dynamic range is limited and poor. Despite digital potentiometers currently employed by some advanced designs to accurately adjust the input and output load impedance values, the major drawback lies in that the integrated circuits of those designs have relatively higher costs.

With reference to FIG. 1, the inventor of the present invention had implemented some changes on a power adjusting structure of an opto-interrupter, namely, a plurality of load impedances ZI and ZL respectively mounted to two sides of the opto-interrupter to correspond to m and n IC control pins, to have variation of $m^{th}$ power of 2 and $n^{th}$ power of 2 combinations. As a result, the dynamic ranges of the transmitter and the receiver can be respectively adjusted to simultaneously realize multi-stage adjustment and lower structure cost.

Such design has a broader operating range and better penetration of printing medias (including label paper and printing ribbon) than conventional structures. However, current printing medias are of varieties and different in quality, and their light transmittance falls in pretty wide dynamic range. The light transmittance of some media may be good, but that of some others may be poor. If the adjustable two-sided load impedance circuit structure is the only one adopted, the wide dynamic range for different printing media can be hardly covered. When encountering special or thicker printing media, such circuit structure still fails to deliver effective light transmittance (as shown in FIG. 2).

SUMMARY OF THE INVENTION

In view of the foregoing shortcomings, a main objective of the present invention is to provide a power control circuit of opto-interrupter dedicated for printers enabling to acquire a broader dynamic range of the load of the receiving terminal.

The power control circuit of opto-interrupter has an opto-interrupter, a plurality of impedances and a variable frequency generator.

The opto-interrupter having an IR photodiode and an opto-coupling receiver adapted to penetrate and detect a thickness of a printing medium.

The plurality of impedances mounted by stages in accordance with values thereof, one ends of the plurality of impedances are electrically connected an emitter pin of an opto-coupling receiver in parallel. The other ends are electrically connected with relative control pins of an integrated circuit, so that the control pins vary outputs thereof to make the values of the plurality of impedances progressively incremented and decremented in a fixed range.

The variable frequency generator generates variable frequency signals and is electrically connected with a negative pole pin of an IR photodiode.

Given the above-mentioned components, an emitting intensity of the IR photodiode is adjusted so as to penetrate through different printing media to acquire a broader dynamic range.

The foregoing and other features and advantages of the present invention will be more clearly understood through the following descriptions with reference to the drawing, wherein:

DETAILED DESCRIPTION OF THE PREFERRED EMBODIMENT

The present invention will now be described more specifically with reference to the following embodiments. It is to be noted that the following descriptions of preferred embodiments of this invention are presented herein for the purpose of illustration and description only; it is not intended to be exhaustive or to be limited to the precise form disclosed.

Figure 1:
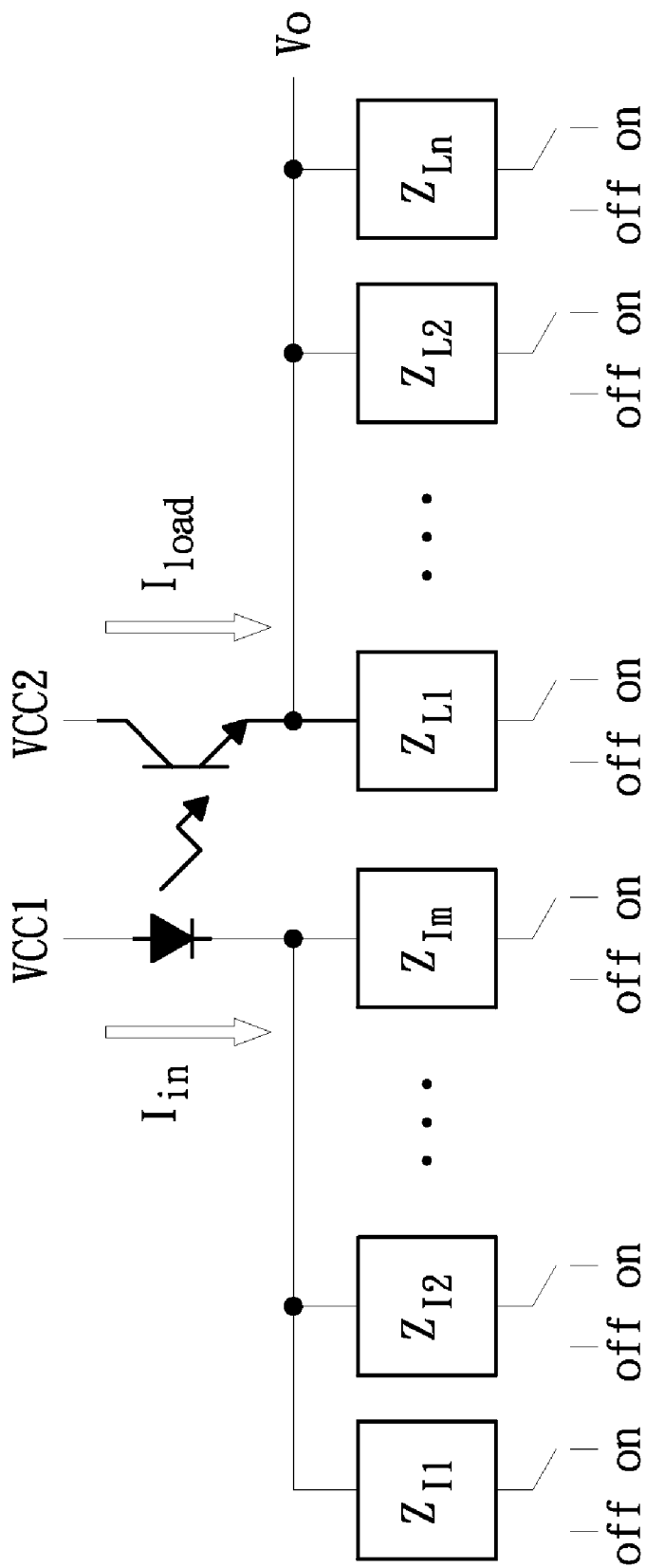
FIG. 1 is a circuit diagram of a conventional opto-interrupter.
Figure 2:
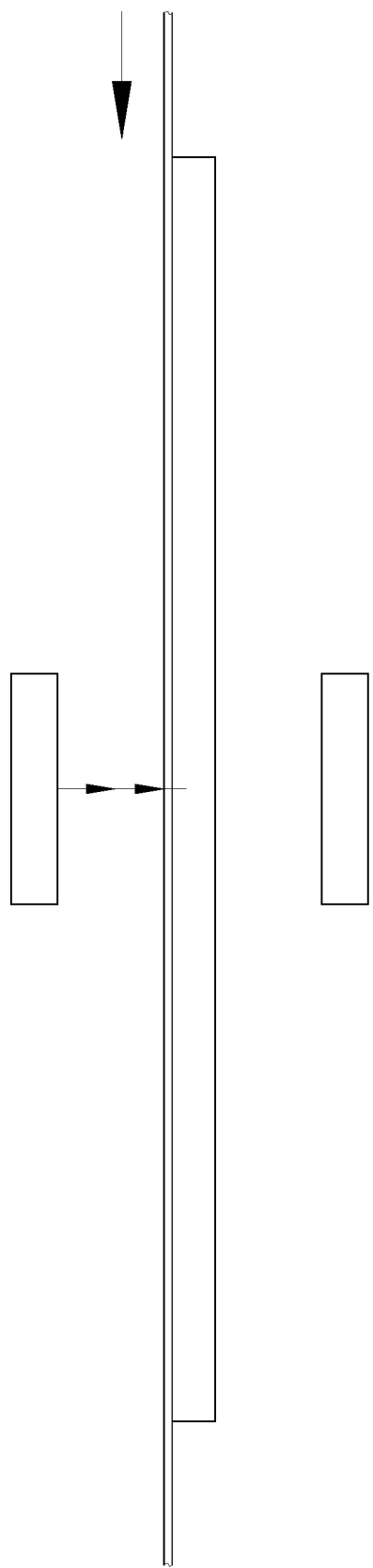
FIG. 2 is a schematic view illustrating that a conventional opto-interrupter fails to penetrate through thick printing medium.
Figure 3:
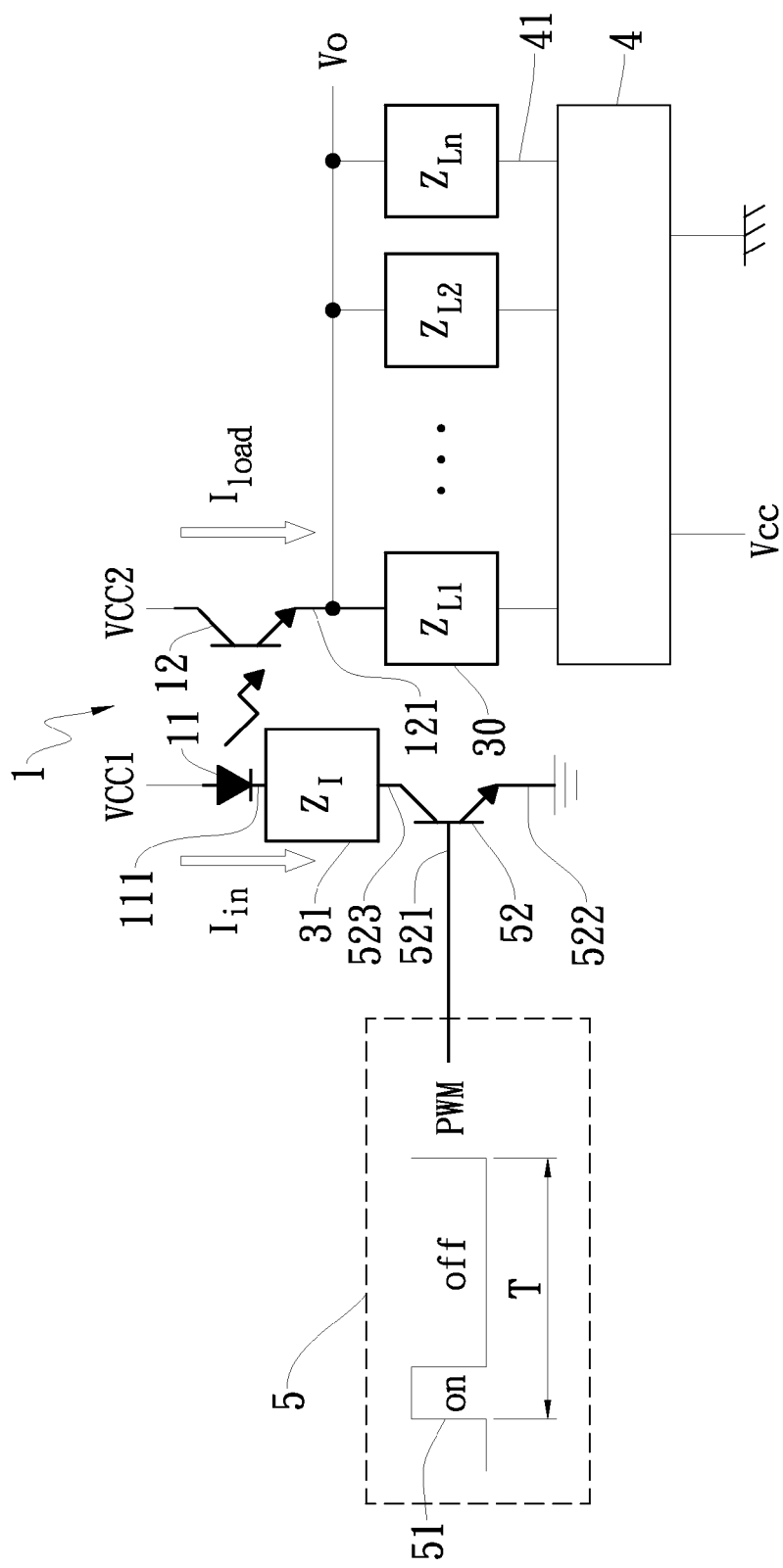
FIG. 3 is a circuit diagram of an opto-interrupter of the present invention.
Figure 6:
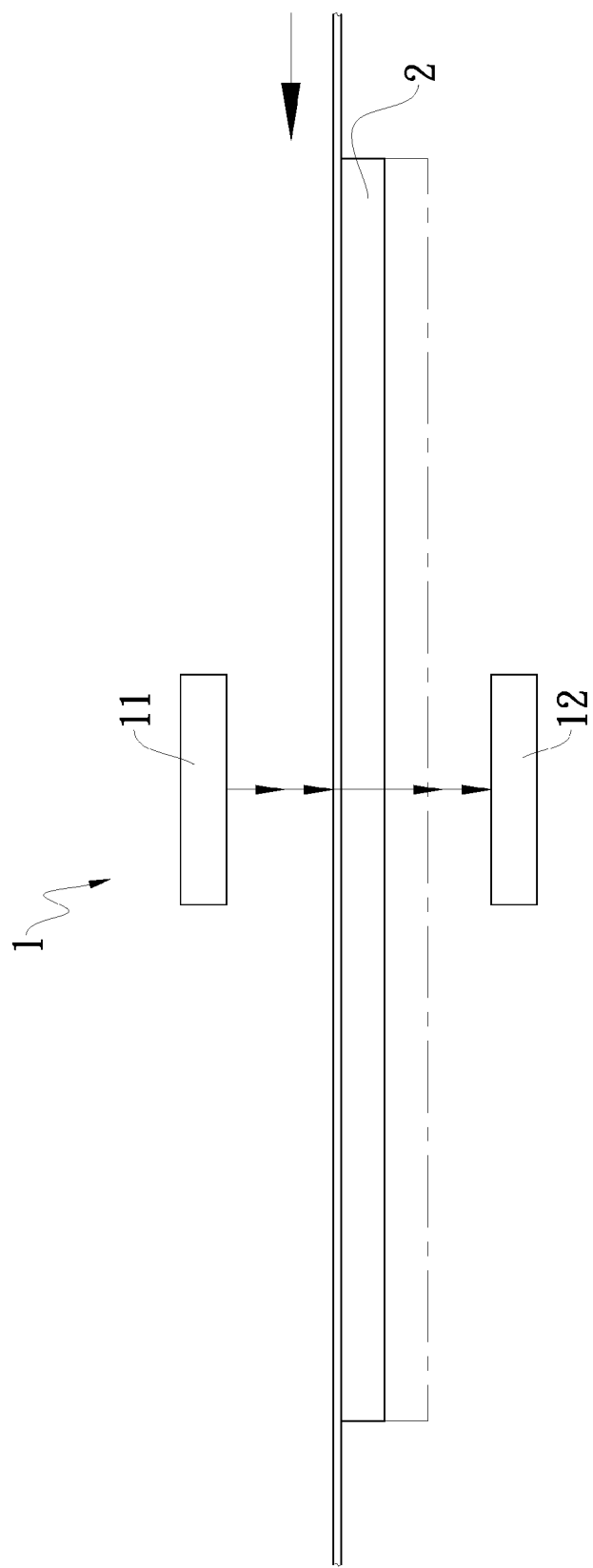
FIG. 6 is an schematic view illustrating that the opto-interrupter of the present invention penetrates through printing media having different thickness.

With reference FIGS. 3 and 6, a power control circuit of a variable-frequency opto-interrupter for a printer of the present invention includes an opto-interrupter (1), a plurality of impedances (30) and a variable frequency generator (5).

The opto-interrupter (1) has an IR photodiode (11) and an opto-coupling receiver (12) for penetrating through a printing medium (2) and detecting a thickness thereof.

The plurality of impedances (30) are mounted by stages according to the impedance values thereof. One ends of the plurality of impedances (30) are electrically connected with an emitter pin (121) of a photo-transistor at an optically-coupled receiving end (12) in parallel, and the other ends are electrically connected with relative control pins (41) of an integrated circuit IC4 to have variable outputs through the control pins (41). To let the total impedance value of the plurality of impedances (30) progressively increment or decrement by stages in a fixed range. If the circuit in FIG. 3 has n impedances (30), the n impedances are divided into $2^n$ stages. The relationship of the n impedances (30) can be expressed by:

$$Zn=ZL\times F^{(n-1)} \text{ where } F \text{ is a real number greater than } 0$$

IC4 may be a digital integrated circuit so that the relative control pins (41) output 0 and 1 to generate accurate $2^n$ stages of adjustment ranges.

A variable frequency generator (5) serves to generate a variable frequency signal (51). The signal (51) is connected to a negative pole pin (111) of the IR photodiode (11) through a switching transistor (52). The variable frequency generator (5) may be mounted on the IC4 (not shown). The PWM variable signal (51) is inputted to a base pin (521) of the switching transistor (52). An emitter pin (522) of the switching transistor is grounded. A collector pin (523) is electrically connected to the negative pole pin (111) of the IR photodiode (11) through the load impedance (31).

Given the circuit structure of the present invention as shown in FIG. 3, the overall circuit structure is simplified and practical. Even though there is no costly digital potentiometer at the optically-coupled receiving end (12), variable outputs of 0 and high impedance are still generated by the relative control pins (41) of the integrated circuit IC4, and $2^n$ stages of adjustment ranges is generated in collaboration with the corresponding n impedances (30), so as to achieve accurate adjustment effect similar to that of a digital potentiometer.

Figure 4:
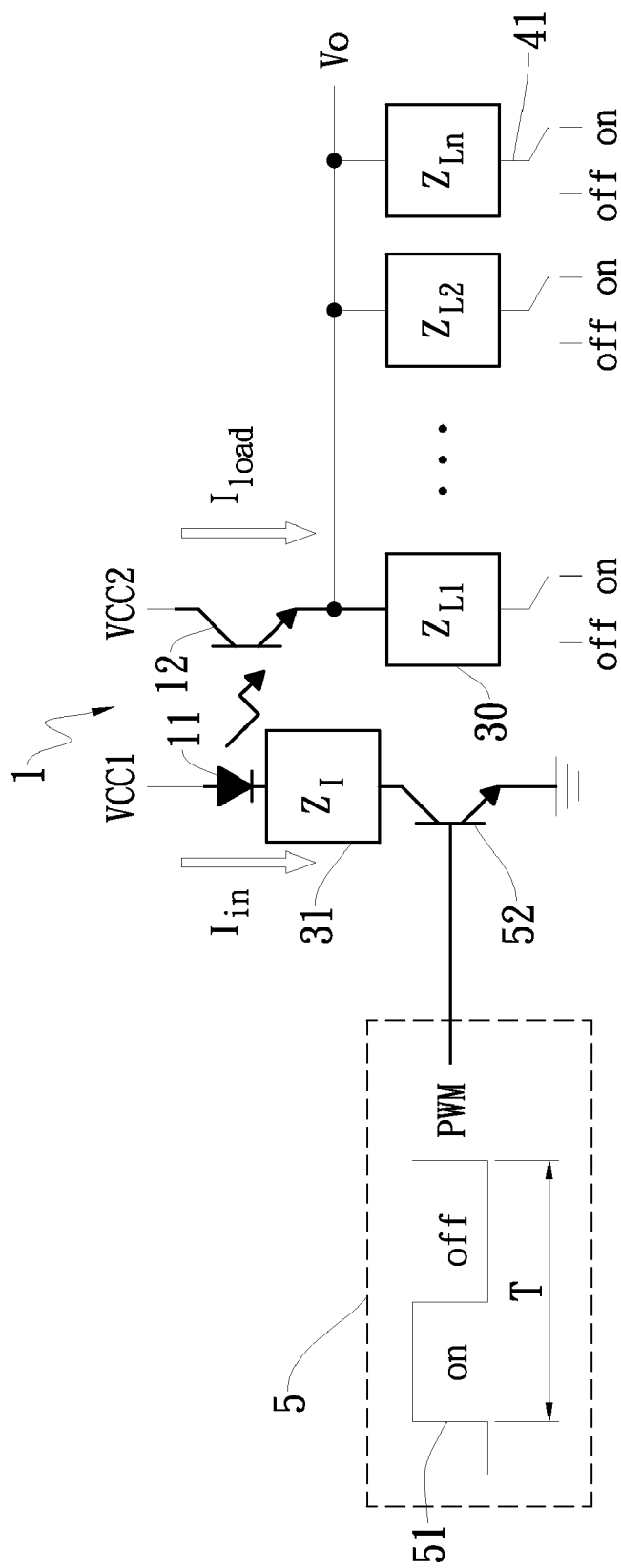
FIG. 4 is a schematic view illustrating one variable-frequency adjustment of the present invention.
Figure 5:
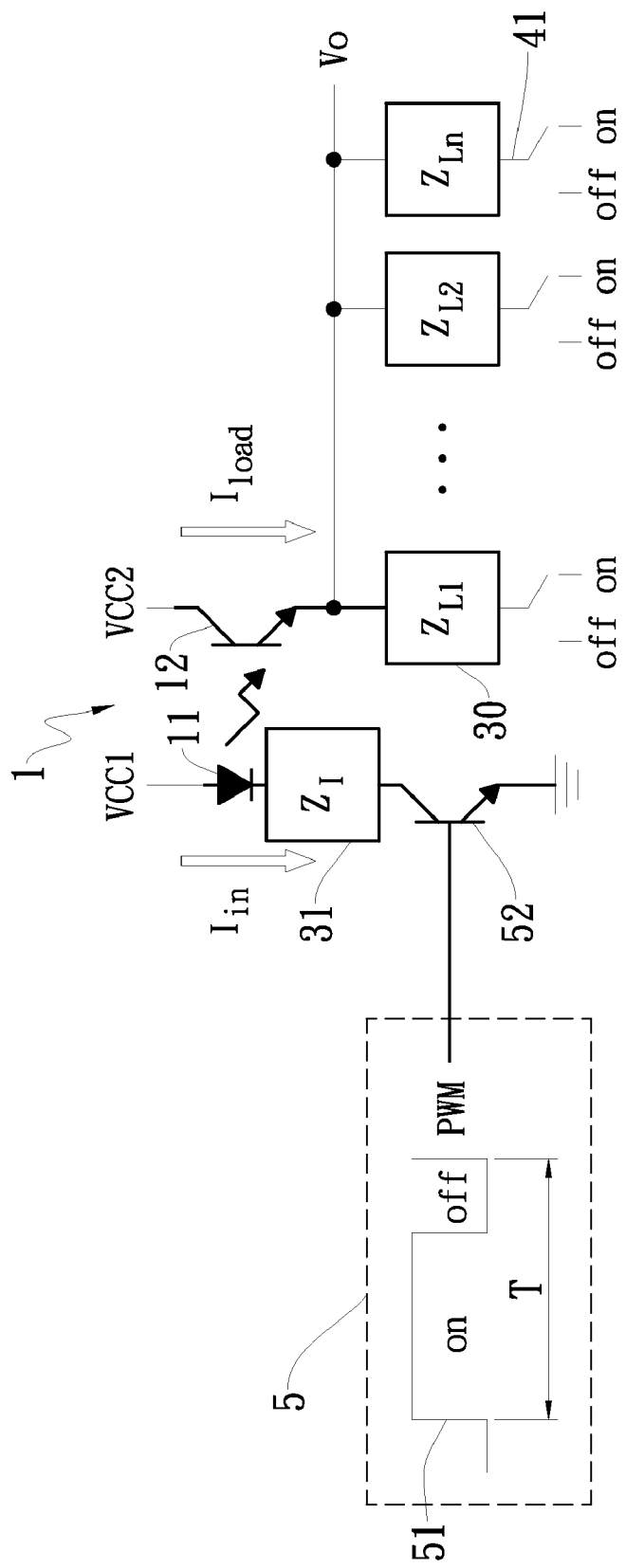
FIG. 5 is a schematic view illustrating another variable-frequency adjustment of the present invention.

With reference to FIGS. 3 to 6, the other side of the opto-interrupter (1) employs the IR photodiode (11) characterized by higher penetration and the variable frequency signal (51) generated by the variable frequency generator (51) to adjust power through the switching transistor (52). With further reference to FIGS. 4 and 5, the IR photodiode (11) generating different emitting intensity in response to the outputs of different variable frequency signals (51), is collaborated with the plurality of adjustable impedances (30) at the optically coupled receiving end (12) to operate, so as to penetrate various printing media (2) as shown in FIG. 6. Meanwhile, the light intensity of the IR photodiode (11) is adjusted to adapt to the optically-coupled receiving end (12) for acquiring a broader dynamic range.

Moreover, practically, resistors may be direct choices of the plurality of impedances (30) since they are inexpensive and accessible. What's worth special attention is that the standard values of impedances from volume production might not be exactly the values specified in the equation. If the accuracy requirement is not strict, error is allowed between stages as long as the absolute value of the error of the (resistance) impedance (30) between two stages is less than half of the first stage (resistance) impedance ZL. Similarly, the plurality of impedances (30) are divided into $2^n$ stages except that geometric ratio does not exist between stages. However, good stage-by-stage adjustment of impedance value can still be maintained.

In sum, the present invention has a simple and practical structure and better function than the conventional power control circuit of an opto-interrupter and provides the practical and innovative value to the industry, and the application is hereby submitted in accordance with the patent laws.

While the invention has been described in terms of what is presently considered to be the most practical and preferred embodiments, it is to be understood that the invention needs not be limited to the disclosed embodiments. On the contrary, it is intended to cover various modifications and similar arrangements included within the spirit and scope of the appended claims, which are to be accorded with the broadest interpretation so as to encompass all such modifications and similar structures.

What is claimed is:

1. A power control circuit of variable-frequency opto-interrupter dedicated for printers, comprising:
   an opto-interrupter having an IR photodiode and an optically-coupled receiving end for penetrating through a printing medium and detecting a thickness thereof;
   a plurality of impedances mounted by stages in accordance with values thereof, one ends of the plurality of impedances electrically connected with an emitter pin of an phototransistor at the optically-coupled receiving end in parallel, and the other ends electrically connected with relative control pins of an integrated circuit, so that the control pins vary outputs thereof to make the values of the plurality of impedances progressively incremented or decremented in a fixed range; and
   a variable frequency generator generating variable frequency signals and electrically connected with a negative pole pin of an IR photodiode;
   whereby an emitting intensity of the IR photodiode is adjusted to penetrate through different printing media so as to acquire a broader dynamic range.

2. The power control circuit of variable-frequency opto-interrupter as claimed in claim 1, wherein the plurality of impedances are n impedances divided into $2^n$ stages, and the relative control pins of the integrated circuit has $2^n$ stages of adjustment ranges.

3. The power control circuit of variable-frequency opto-interrupter as claimed in claim 2, wherein the integrated circuit is a digital integrated circuit, and the relative control pins generate outputs of 0 and 1.

4. The power control circuit of variable-frequency opto-interrupter as claimed in claim 2, wherein the plurality of impedances are expressed by $Zn=ZL\times F^{(n-1)}$, Zn is the value of the impedance at the $n^{th}$ stage, ZL is the value of the impedance at the first stage, and F is a real number greater than 0.

5. The power control circuit of variable-frequency opto-interrupter as claimed in claim 2, wherein the impedances at all stages are not a geometric sequence, and an absolute value of each error between two stages of impedances is less than half of the value of the impedance at the first stage.

6. The power control circuit of variable-frequency opto-interrupter as claimed in claim 2, wherein the variable frequency generator is mounted on the integrated circuit, a PWM variable-frequency signal of the variable frequency generator is inputted through a base pin of a switching transistor, an emitter pin of the switching transistor is grounded, and a collector pin thereof is electrically connected with a load impedance of the negative pole pin of the IR photodiode.

7. The power control circuit of variable-frequency opto-interrupter as claimed in claim 3, wherein the plurality impedances are resistors, and are electrically connected with the emitter pin of the phototransistor at the optically-coupled receiving end in parallel.

8. The power control circuit of variable-frequency opto-interrupter as claimed in claim 4, wherein the plurality impedances are resistors, and are electrically connected with the emitter pin of the phototransistor at the optically-coupled receiving end in parallel.

9. The power control circuit of variable-frequency opto-interrupter as claimed in claim 5, wherein the plurality impedances are resistors, and are electrically connected with the emitter pin of the phototransistor at the optically-coupled receiving end in parallel.

10. The power control circuit of variable-frequency opto-interrupter as claimed in claim 6, wherein the plurality impedances are resistors, and are electrically connected with the emitter pin of the phototransistor at the optically-coupled receiving end in parallel.

* * * * *